(12) United States Patent
Ochi et al.

(10) Patent No.: US 9,041,221 B2
(45) Date of Patent: May 26, 2015

(54) ELECTRONIC COMPONENT IMPLEMENTING STRUCTURE INTERMEDIATE BODY, ELECTRONIC COMPONENT IMPLEMENTING STRUCTURE BODY AND MANUFACTURING METHOD OF ELECTRONIC COMPONENT IMPLEMENTING STRUCTURE BODY

(75) Inventors: Shozo Ochi, Osaka (JP); Kazuya Ushirokawa, Osaka (JP); Keiichi Kusumoto, Hyogo (JP); Takashi Yamada, Hyogo (JP); Ken Yasue, Kyoto (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 13/993,714

(22) PCT Filed: Sep. 12, 2011

(86) PCT No.: PCT/JP2011/005110
§ 371 (c)(1),
(2), (4) Date: Jun. 13, 2013

(87) PCT Pub. No.: WO2012/086107
PCT Pub. Date: Jun. 28, 2012

(65) Prior Publication Data
US 2013/0277862 A1     Oct. 24, 2013

(51) Int. Cl.
*H01L 23/538* (2006.01)
*H01L 23/00* (2006.01)
(Continued)

(52) U.S. Cl.
CPC ............. *H01L 23/5386* (2013.01); *H01L 24/14* (2013.01); *H01L 25/0652* (2013.01);
(Continued)

(58) Field of Classification Search
CPC ..... H01L 23/5386; H01L 24/80; H01L 24/97; H01L 2224/97; H01L 2225/107
USPC .......................................... 257/777; 438/109
See application file for complete search history.

(56) References Cited

U.S. PATENT DOCUMENTS 4,941,033 A     7/1990 Kishida
4,949,224 A *   8/1990 Yamamura et al. ........... 361/784
(Continued)

FOREIGN PATENT DOCUMENTS

JP     62-67828 A     3/1987
JP     63-136642 A    6/1988
(Continued)

OTHER PUBLICATIONS

International Search Report for Application No. PCT/JP2011/005110, dated Dec. 13, 2011.

*Primary Examiner* — Peniel M Gumedzoe
(74) *Attorney, Agent, or Firm* — RatnerPrestia (57) ABSTRACT

An implementing structure intermediate body including: a first chip having a first connection terminal; a second chip having a second connection terminal in a face that faces the first chip; and a film wiring substrate having a third connection terminal in one face, which is arranged between the first chip and the second chip, is loaded on a chip loading substrate having a fifth connection terminal so that another one face of the first chip is confronted thereby. In the film wiring substrate, there is a portion that is located outside any of the first chip and the second chip, at the tip part, is provided a fourth connection terminal connected to the third connection terminal by wiring, one part of the first connection terminal is connected with the second connection terminal, the third connection terminal is connected with another one part of the first connection terminal, and the fifth connection terminal is connected to the fourth connection terminal.

8 Claims, 8 Drawing Sheets

(51) Int. Cl.
  *H01L 25/065* (2006.01)
  *H01L 25/18* (2006.01)
  *H01L 23/498* (2006.01)

(52) U.S. Cl.
  CPC ..... *H01L25/0657* (2013.01); *H01L 2224/1403* (2013.01); *H01L 2225/06513* (2013.01); *H01L 2225/06517* (2013.01); *H01L 24/16* (2013.01); *H01L 24/81* (2013.01); *H01L 2224/81193* (2013.01); *H01L 2924/15311* (2013.01); *H01L 24/05* (2013.01); *H01L 25/18* (2013.01); *H01L 2224/0401* (2013.01); *H01L 2224/16148* (2013.01); *H01L 2224/16225* (2013.01); *H01L 2224/48227* (2013.01); *H01L 2224/73207* (2013.01); *H01L 2224/73253* (2013.01); *H01L 2924/1431* (2013.01); *H01L 2924/1434* (2013.01); *H01L 23/49833* (2013.01); *H01L 23/4985* (2013.01); *H01L 2224/32225* (2013.01); *H01L 2224/73265* (2013.01); *H01L 24/80* (2013.01); *H01L 23/49816* (2013.01)

(56) References Cited

U.S. PATENT DOCUMENTS

| | | | |
|---|---|---|---|
| 5,477,082 A * | 12/1995 | Buckley et al. | 257/679 |
| 7,217,994 B2 * | 5/2007 | Zhu et al. | 257/686 |
| 2007/0278642 A1 | 12/2007 | Yamaguchi et al. | |
| 2008/0001305 A1 | 1/2008 | Uchida | |
| 2009/0014890 A1 | 1/2009 | Takahashi | |
| 2010/0065953 A1* | 3/2010 | Egawa | 257/686 |
| 2010/0255614 A1 | 10/2010 | Uchida | |

FOREIGN PATENT DOCUMENTS

| | | |
|---|---|---|
| JP | 03-190146 | 8/1991 |
| JP | 05-235259 A | 9/1993 |
| JP | 08-125112 A | 5/1996 |
| JP | 10-150117 | 6/1998 |
| JP | 2001-093943 | 4/2001 |
| JP | 2004-207566 A | 7/2004 |
| JP | 2004-247464 A | 9/2004 |
| JP | 2005-044989 | 7/2005 |
| JP | 2005-347513 A | 12/2005 |
| JP | 2007-324354 A | 12/2007 |
| JP | 2008-010759 A | 1/2008 |
| JP | 2008-235823 A | 10/2008 |
| JP | 2009-088110 A | 4/2009 |
| JP | 2010-141080 A | 6/2010 |

* cited by examiner

ELECTRONIC COMPONENT IMPLEMENTING STRUCTURE INTERMEDIATE BODY, ELECTRONIC COMPONENT IMPLEMENTING STRUCTURE BODY AND MANUFACTURING METHOD OF ELECTRONIC COMPONENT IMPLEMENTING STRUCTURE BODY

CROSS-REFERENCE TO RELATED APPLICATIONS

This application is a U.S. national phase application of PCT International Patent Application No. PCT/JP2011/005110 filed Sep. 12, 2011, claiming the benefit of priority of Japanese Patent Application No. 2010-288285 filed Dec. 24, 2010, all of which are incorporated by reference herein in their entirety.

TECHNICAL FIELD

The present invention relates to an electronic component implementing structure intermediate body, an electronic component implementing structure body and a manufacturing method thereof, such that utilized is a chip-on-chip (CoC) technology and so forth with constitution by laminating electronic components represented by semiconductor chips.

BACKGROUND ART

Recently, the requirements for downsizing and weight reduction, and a high-function and high-performance of electronic equipment have been getting more and more intense, and the amount of handled data has been increasing dramatically.

With this, the memory capacity of a semiconductor memory that is mounted on the electronic equipment also increases, and a semiconductor memory that has a high data transfer rate is required.

Generally, as semiconductor devices that are loaded on electronic equipment of this kind, there are a System-on-Chip (SoC) such that the logic (controller) and the memory are integrated into one chip, and a System-in-Package (SiP) such that the logic chip and the memory chip are laminated and stored in one package.

For the SoC, the semiconductor processes are complicated, and the costs become high in accordance with that. In contrast to this, since the SiP is constituted by packaging plural semiconductor chips that have been individually manufactured utilizing existing semiconductor processes, it is not necessary to develop new semiconductor processes, and the manufacturing costs are comparatively low. Because of this, electronic equipment with the SiP utilized tends to increase nowadays.

Moreover, for the SiP, in order that the parasitic LCR is allowed to be small and the data transfer rate is allowed to be high, a Chip-on-Chip (CoC) technology has been developed such that direct flip chip connections are carried out between the chips via micro bumps and the like.

In a semiconductor device with such a CoC technology utilized, generally, the logic chip is arranged on the lower side and the memory chip is laminated on the upper side but, when the memory capacity of the memory chip becomes large, it tends to get larger in size than the logic chip. Accordingly, in such a case it is general that the memory chip is arranged on the lower side and the logic chip is laminated on the upper side (for example, see Japanese published patent application 2008-10759).

In this case, also in a semiconductor device with the CoC technology as described above utilized, since external connection terminals (pads) have been provided separately with respect to the logic chip and the memory chip, it has been necessary to specially ensure regions for forming the external connection terminals in respective chips. Besides, it is necessary to form a through electrode (TSV) in either of the logic chip and the memory chip, and cost lowering by downsizing of each chip itself and manufacturing process reducing has been unable to be sufficiently accomplished.

In order to solve this problem, there is also such a one for which downsizing as the whole of a semiconductor device and reducing of the manufacturing process have been achieved with the terminals for external connection collected on the semiconductor memory chip side, by the above-described CoC technology, in a semiconductor device configured so that the semiconductor logical circuit chip that is smaller in size than the semiconductor memory chip is laminated (for example, see Japanese published patent application 2010-141080).

Figure 10A:
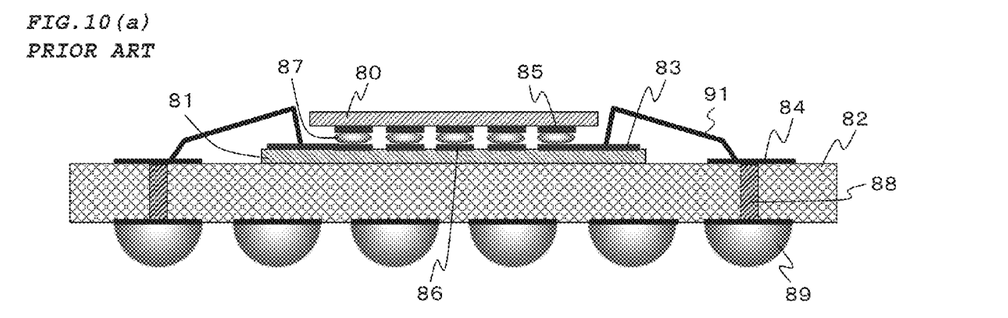
FIG. 10(a) is a sectional view that shows the constitution of a conventional electronic component implementing structure body.

In FIG. 10(a), is shown a sectional view that shows the constitution of an electronic component implementing structure body that is disclosed in Japanese published patent application 2010-141080.

In one face of the semiconductor memory chip 81, the terminal 83 for external connection is formed in the connection terminal 86 and the outer fringe part, and the connection terminal 86 and the terminal 83 for external connection are electrically connected via the internal wiring layer of the semiconductor memory chip 81. On the connection terminal 86, the protruding electrode 87 is formed.

The semiconductor logical circuit chip 80 with the connection terminal 85 formed in one face is, by the CoC, laminated to the semiconductor memory chip 81 so that the connection terminal 85 electrically comes in contact with the protruding electrode 87.

Moreover, the semiconductor memory chip 81 is laminated on the interposer substrate 82, and the connection terminal 84 formed in one face of the interposer substrate 82 is connected via the through hole 88 to the protruding electrode 89 that is formed in the opposite face.

By connecting, by wire bonding and the like with the wire 91, the terminal 83 for external connection of the semiconductor memory chip 81 and the connection terminal 84 of the interposer substrate 82, the connection terminal 85 of the semiconductor logical circuit chip 80 is electrically connected, via the protruding electrode 87, the connection terminal 86, the terminal 83 for external connection, the wire 91, the connection terminal 84 and the through hole 88, to the protruding electrode 89 of the opposite face of the interposer substrate 82.

By making constitution like this, establishment of external connection terminals in the semiconductor logical circuit chip 80 is allowed to be unnecessary, and downsizing of the whole of the semiconductor device is realized.

SUMMARY OF INVENTION

Problems to be Solved by Invention

However, in a semiconductor device of the conventional constitution as has been shown in FIG. 10(a), depending on the sizes of the semiconductor memory chip and the semiconductor logical circuit chip, there have been cases where downsizing of the chip and the whole of the semiconductor device is unable to be sufficiently accomplished.

Regarding this problem, descriptions are given in what follows.

In the semiconductor device that is disclosed in Japanese published patent application 2010-141080, as shown in FIG. 10(a), while the terminal 83 for external connection on the side of the semiconductor memory chip 81 and the connection terminal 84 of the interposer substrate 82 are allowed to be connected, since the connection is carried out by wire bonding and the like with the wire 91, with respect to the semiconductor logical circuit chip 80, for the semiconductor memory chip 81 it is necessary to enlarge the chip size at least for the region of the terminal 83 for external connection.

Figure 10B:
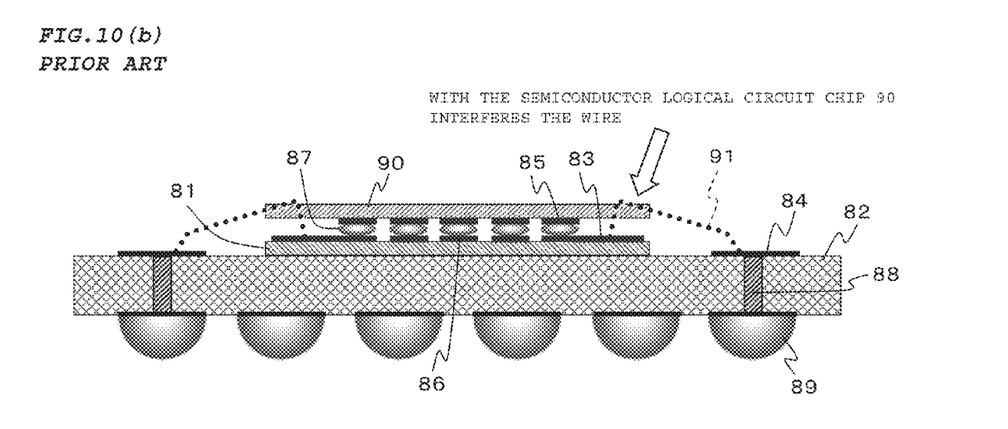
FIG. 10(b) is a sectional view for describing the problem, which shows the constitution of a conventional electronic component implementing structure body.

In FIG. 10(b), is shown a sectional view that shows the constitution in a case where the semiconductor logical circuit chip 90 of the same size as the semiconductor memory chip 81 is, as an electronic component implementing structure body of conventional structure, utilized.

As shown in FIG. 10(b), in the case where the semiconductor logical circuit chip 90 and the semiconductor memory chip 81 are of the same size, when the wire 91 (shown in the figure with dotted lines) exits from the terminal 83 for external connection of the semiconductor memory chip 81, since the wire 91 interferes with the semiconductor logical circuit chip 90, wire bonding becomes unable to be carried out (see the arrow in the figure). As a result, the size of the semiconductor memory chip 81 has to be more enlarged, and downsizing of the chip and the whole of the semiconductor device has been unable to be sufficiently accomplished.

An aspect of the present invention is, in view of the above-mentioned conventional problems, to furnish an electronic component implementing structure intermediate body, an electronic component implementing structure body and a manufacturing method thereof such that, in a semiconductor device in which, by the CoC technology, at least two semiconductor chips have been laminated, downsizing of the chips is possible even if each chip is of arbitrary size.

Means of Solving Problem

In order to solve the problems described above, the $1^{st}$ aspect of the present invention is an electronic component implementing structure intermediate body, comprising:

a first semiconductor chip that has a first connection terminal in one face;

a second semiconductor chip that has a second connection terminal in a face which faces the one face of the first semiconductor chip; and a film wiring substrate that has a third connection terminal at least in one face, and is arranged between the first semiconductor chip and the second semiconductor chip, wherein at least one part of the first connection terminal is connected with at least one part of the second connection terminal, and the third connection terminal is connected at least with either of another one part of the first connection terminal and another one part of the second connection terminal.

Moreover, the $2^{nd}$ aspect of the present invention is an electronic component implementing structure intermediate body according to the $1^{st}$ aspect of the present invention, wherein in the film wiring substrate, there is a portion that is located outside any end parts of the first semiconductor chip and the second semiconductor chip, and at a tip part of the portion that is located outside, is provided a fourth connection terminal that is connected to the third connection terminal by wiring.

Moreover, the $3^{rd}$ aspect of the present invention is an electronic component implementing structure intermediate body according to the $2^{nd}$ aspect of the present invention, wherein the film wiring substrate has flexibility.

Moreover, the $4^{th}$ aspect of the present invention is an electronic component implementing structure intermediate body according to the $2^{nd}$ aspect of the present invention, wherein in the film wiring substrate, is provided a hole part, and the at least one part of the first connection terminal, and the at least one part of the second connection terminal are connected via the hole part.

Moreover, the $5^{th}$ aspect of the present invention is an electronic component implementing structure intermediate body according to the $2^{nd}$ aspect of the present invention, wherein in at least one spot of an outer fringe part of the film wiring substrate, there is a notch.

Moreover, the $6^{th}$ aspect of the present invention is an electronic component implementing structure intermediate body according to the $2^{nd}$ aspect of the present invention, wherein the film wiring substrate is divided into plural individual pieces.

Moreover, the $7^{th}$ aspect of the present invention is an electronic component implementing structure intermediate body according to the $2^{nd}$ aspect of the present invention, wherein the first semiconductor chip and the second semiconductor chip are arranged so as to be opposing, and a difference between each correspondingly opposing side of the first semiconductor chip and the second semiconductor chip is within ±5%.

Moreover, the $8^{th}$ aspect of the present invention is an electronic component implementing structure body, comprising:

an electronic component implementing structure intermediate body according to any of the $2^{nd}$-$7^{th}$ aspects of the present invention; and a chip loading substrate having a fifth connection terminal, on which the electronic component implementing structure intermediate body is loaded so that another one face of the first semiconductor chip is confronted thereby, wherein the fifth connection terminal is connected to the fourth connection terminal of the film wiring substrate.

Moreover, the $9^{th}$ aspect of the present invention is an electronic component implementing structure body according to the $8^{th}$ aspect of the present invention, wherein in the chip loading substrate, is formed a concave portion, and the electronic component implementing structure intermediate body is, on the chip loading substrate, loaded so that the first semiconductor chip fits into the concave portion.

Moreover, the $10^{th}$ aspect of the present invention is a manufacturing method of an electronic component implementing structure body, comprising:

a semiconductor chip loading step of loading, onto a chip loading substrate, a first semiconductor chip with a first connection terminal formed in one face so that a face in which the first connection terminal is not formed is confronted thereby;

a first terminal connecting step of electrically connecting one part of the first connection terminal of the first semiconductor chip, and a third connection terminal formed in one face of a film wiring substrate;

a second terminal connecting step of, from a side where connection of the film wiring substrate of the first semiconductor chip has been carried out, overlaying and laminating a second semiconductor chip with a second connection terminal formed in one face, and then electrically connecting the first connection terminal that is not connected to the third connection terminal, and the second connection terminal; and a third terminal connecting step of electrically connecting, to a fifth connection terminal that is formed on the chip loading substrate, a fourth connection terminal that is formed at a tip portion of a portion of the film wiring substrate, the portion being located outside any end parts of the first semiconductor chip and the second semiconductor chip, and is connected to the third connection terminal.

Moreover, the 11$^{th}$ aspect of the present invention is a manufacturing method of an electronic component implementing structure body according to the 10$^{th}$ aspect of the present invention, wherein processing of the first terminal connecting step, the second terminal connecting step, the semiconductor chip loading step, and the third terminal connecting step are carried out in that order.

Moreover, the 12$^{th}$ aspect of the present invention is a manufacturing method of an electronic component implementing structure body according to the 10$^{th}$ aspect of the present invention, wherein processing of the first terminal connecting step, the semiconductor chip loading step, the third terminal connecting step, and the second terminal connecting step are carried out in that order.

Moreover, the 13$^{th}$ aspect of the present invention is a manufacturing method of an electronic component implementing structure body according to the 10$^{th}$ aspect of the present invention, wherein processing of the semiconductor chip loading step, the first terminal connecting step, the second terminal connecting step, and the third terminal connecting step are carried out in that order.

Effects of Invention

By the present invention, an electronic component implementing structure intermediate body, an electronic component implementing structure body and a manufacturing method thereof are able to be furnished such that, in a semiconductor device in which, by the CoC technology, at least two semiconductor chips have been laminated, downsizing of the chips is possible even if each chip is of arbitrary size.

BRIEF DESCRIPTION OF DRAWINGS

FIGS. 2(a)-(f) are sectional views that show the forming step of the electronic component implementing structure body pertaining to the first embodiment of the present invention.

MODES FOR CARRYING OUT INVENTION

In the following, regarding embodiments of the present invention, descriptions are given referring to the drawings. Further, regarding the same elements, the same symbols are assigned and there are cases where descriptions are omitted.

First Embodiment

Figure 1A:
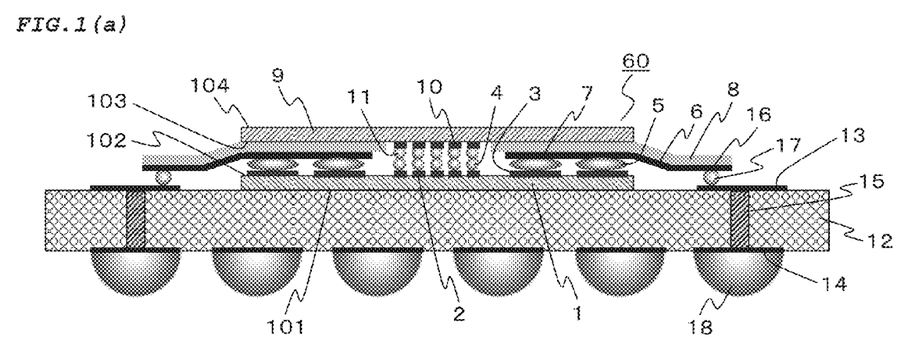
FIG. 1(a) is a sectional view that shows the constitution of an electronic component implementing structure body pertaining to the first embodiment of the present invention.
Figure 1B:
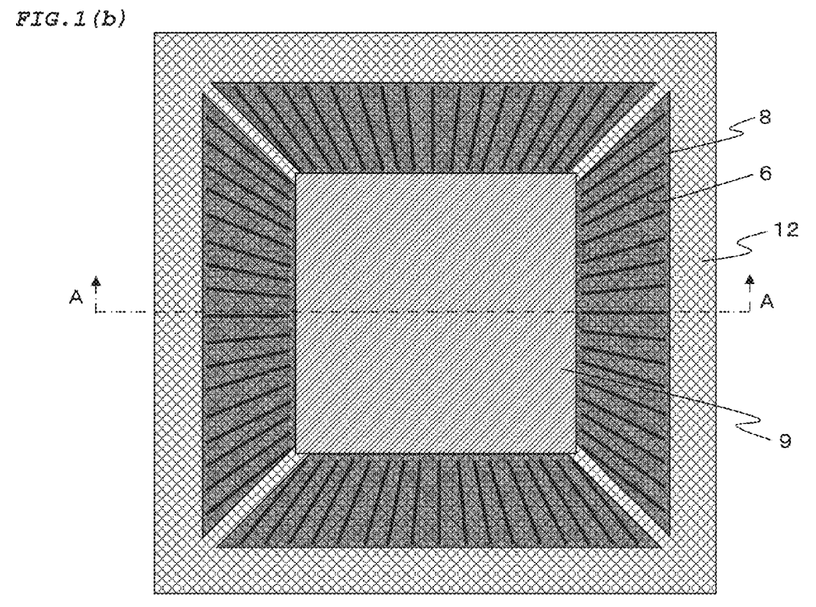
FIG. 1(b) is a plane view that shows the constitution of the electronic component implementing structure body pertaining to the first embodiment of the present invention.

FIG. 1(a) is a sectional view that shows the constitution of an electronic component implementing structure body pertaining to the first embodiment of the present invention, and FIG. 1(b) is a plane view that shows the constitution of the electronic component implementing structure body pertaining to the present embodiment. FIG. 1(a) shows the A-A in-between section of FIG. 1(b).

The semiconductor logical circuit chip 1 that has the first plane 101 and the second plane 102, and the semiconductor memory chip 9 that has the third plane 103 and the fourth plane 104 are overlaid, the film wiring substrate 8 that has flexibility is, between the semiconductor logical circuit chip 1 and the semiconductor memory chip 9, arranged, and the electronic component implementing structure intermediate body 60 of the present embodiment is constituted.

Electrically connected via the protruding electrode 4 and the protruding electrode 11 are the connection terminal group 2 of the second plane 102 and the connection terminal group 10 of the third plane 103, and the connection terminal group 3 of the second plane 102 and the connection terminal group 7 on the film wiring substrate 8 are electrically connected via the protruding electrode 5.

Besides, onto the resin substrate (interposer substrate) 12 that has the connection terminal group 13 in one face and the connection terminal group 14 in the other face, and has the through hole 15 which connects the two, the electronic component implementing structure intermediate body 60 of the present embodiment is loaded, and the electronic component implementing structure body of the present embodiment is constituted.

The connection terminal group 16 that has been formed on the film wiring substrate 8 and the connection terminal group 13 that has been formed on the resin substrate 12 are electrically connected via the protruding electrode 17. Besides, the protruding electrode 18 is formed in the connection terminal group 14 that has been formed on the resin substrate 12. In the film wiring substrate 8, the film wiring layer 6 is formed, and the connection terminal group 7 and the connection terminal group 16 are electrically connected by this film wiring layer 6.

Further, the semiconductor logical circuit chip 1 corresponds to one example of a first semiconductor chip of the present invention, and the semiconductor memory chip 9 corresponds to one example of a second semiconductor chip of the present invention. Moreover, the connection terminal group 2 corresponds to one example of at least one part of the first connection terminal of the present invention, and the connection terminal group 3 corresponds to one example of another one part of the first connection terminal of the present invention. Moreover, the connection terminal group 10 corresponds to one example of a second connection terminal of the present invention. Moreover, the connection terminal group 7 corresponds to one example of a third connection terminal of the present invention, and the connection terminal group 16 corresponds to one example of a fourth connection terminal of the present invention. Moreover, the resin substrate 12 corresponds to one example of a chip loading substrate of the present invention, and the connection terminal group 13 corresponds to one example of a fifth connection terminal of the present invention.

In FIGS. 2(a)-(f), are shown sectional views that show the forming step of the electronic component implementing structure body pertaining to the present embodiment.

The electronic component implementing structure body that has been shown in FIG. 1 is able to be fabricated by the step of FIG. 2. Utilizing FIG. 2, descriptions are given in what follows regarding the fabricating method of the electronic component implementing structure body of the present embodiment.

Figure 2A:
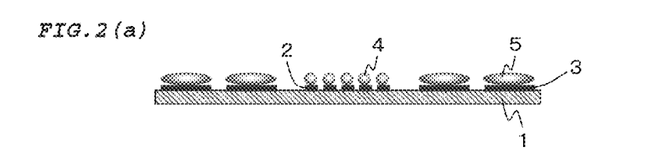

In the beginning, as shown in FIG. 2(a), the connection terminal group 2 and the connection terminal group 3 are formed on one face of the semiconductor logical circuit chip 1 that is made of a semiconductor material, the protruding electrode 4 is formed besides on the connection terminal group 2, and the protruding electrode 5 is formed on the connection terminal group 3.

Figure 2B:
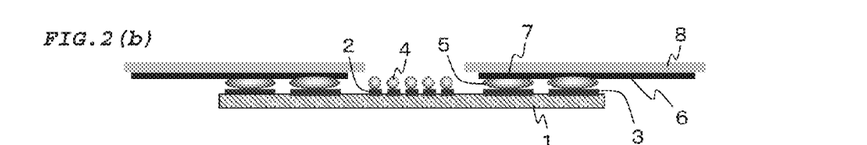
Figure 2C:
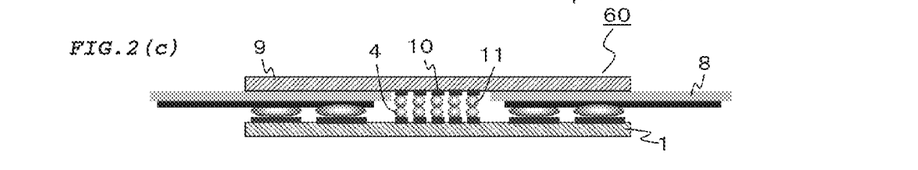

Next, as shown in FIG. 2(b), the film wiring substrate 8 with the film wiring layer 6 and the connection terminal group 7 formed on one face is overlaid onto the semiconductor logical circuit chip 1, and the protruding electrode 5 and the connection terminal group 7 are electrically connected. Further, at this time, a sealing resin may be injected between the semiconductor logical circuit chip 1 and the film wiring substrate 8 to carry out connection.

Further, the film wiring layer 6 corresponds to one example of wiring that connects the third connection terminal and the fourth connection terminal of the present invention.

Moreover, the step shown in FIG. 2(b) that overlays the film wiring substrate 8 to the semiconductor logical circuit chip 1 and electrically connects the connection terminal group 3 and the connection terminal group 7 corresponds to one example of a first terminal connecting step of the present invention.

Here, descriptions are given regarding the constitution of the film wiring substrate in present embodiment.

Figure 3A:
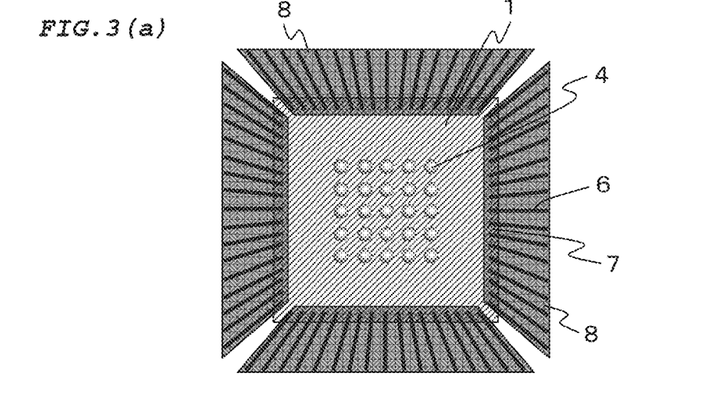
FIG. 3(a) is a plane view in the first embodiment of the present invention, when the film wiring substrate has been overlaid onto the semiconductor logical circuit chip.

Shown in FIG. 3(a) is a plane view when the film wiring substrate 8 has been overlaid onto the semiconductor logical circuit chip 1 as in FIG. 2(b).

In this case, as in FIG. 3(a), the film wiring substrate 8 in which the film wiring layer 6 and the connection terminal group 7 have been formed is allowed to be divided into 4 individual pieces, and is overlaid onto the semiconductor logical circuit chip 1 so as not to interfere with the protruding electrode 4.

Figure 3B:
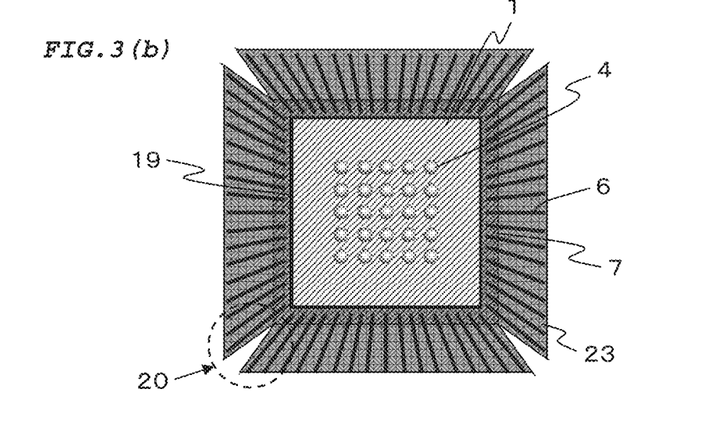
FIG. 3(b) is a plane view in a case where a film wiring substrate of other constitution has been utilized in the first embodiment of the present invention, when the film wiring substrate has been overlaid onto the semiconductor logical circuit chip.
Figure 3C:
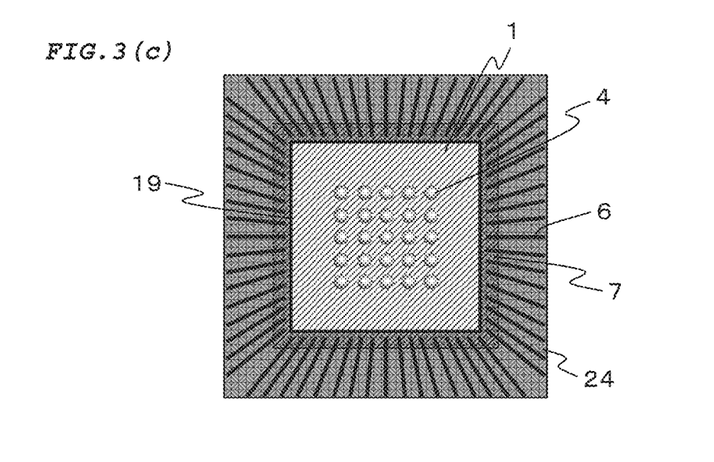
FIG. 3(c) is a plane view in a case where a film wiring substrate of other constitution has been utilized in the first embodiment of the present invention, when the film wiring substrate has been overlaid onto the semiconductor logical circuit chip.

By making such constitution that the film wiring substrate 8 is divided into 4 individual pieces like this, compared with the constitution as shown in FIG. 3(b) and FIG. 3(c) to be described later such that the insides of the 4 individual pieces are linked, in a semiconductor device with the CoC technology utilized, while the connection terminal group 7 of the film wiring substrate 8 and the connection terminal group 3 of the semiconductor logical circuit chip 1 are electrically connected, since the influence from other individual piece portions is less prone to be suffered, it becomes possible to alleviate position aberration of the connection terminals that is generated due to the expansion and contraction of the film wiring substrate 8.

In FIG. 3(b) and FIG. 3(c), are shown plane views in cases where film wiring substrates of other constitution have been utilized, when the film wiring substrates have been overlaid onto the semiconductor logical circuit chips 1.

The film wiring substrate 23 that is shown in FIG. 3(b) is, in contrast to the film wiring substrate 8 in which the film wiring layer 6 and the connection terminal group 7 have been formed, one not divided into 4 individual pieces, such that the boring hole 19 and the notches 20 at four spots of the end part have been formed, and is overlaid onto the semiconductor logical circuit chip 1 so as not to interfere with the protruding electrode 4.

By making such constitution that the notches 20 have been formed at the four corners of the film wiring substrate 23 like this, compared with the constitution as shown in FIG. 3(c) such that the notches 20 are not formed, while the connection terminal group 16 of the film wiring substrate 23 and the connection terminal group 13 of the resin substrate are electrically connected, it becomes possible to alleviate position aberration of the connection terminal groups that is generated due to the bending of the film wiring substrate 23. Further, the notches 20 do not need to be formed at all the four corners, and it is enough that the notch 20 is formed at at least one corner.

Further, the boring hole 19 corresponds to one example of a hole part of the present invention.

Moreover, the film wiring substrate 24 that is shown in FIG. 3(c) is, in contrast to the film wiring substrate 8 in which the film wiring layer 6 and the connection terminal group 7 have been formed, one not divided into 4 individual pieces, such that the boring hole 19 has been formed, and is overlaid onto the semiconductor logical circuit chip 1 so as not to interfere with the protruding electrode 4.

By making constitution like this, in a semiconductor device with the CoC technology utilized, it becomes possible to electrically connect en bloc the connection terminal group 7 of the film wiring substrate 24 and the connection terminal group 3 of the semiconductor logical circuit chip 1, and a reduction of the manufacturing process becomes possible.

After the film wiring substrate 8 has been overlaid onto the semiconductor logical circuit chip 1 as in FIG. 2(*b*), next, as shown in FIG. 2(*c*), the semiconductor memory chip 9, which is made of a semiconductor material, such that the connection terminal group 10 has been formed on one face and besides, the protruding electrode 11 has been formed on it, is overlaid onto the film wiring substrate 8, and the protruding electrode 4 and the protruding electrode 11 are electrically connected.

Further, the constitution shown in FIG. 2(*c*) when the semiconductor memory chip 9 has been overlaid onto the film wiring substrate 8 that has been loaded onto the semiconductor logical circuit chip 1 corresponds to one example of an electronic component implementing structure intermediate body of the present invention.

Moreover, the step shown in FIG. 2(*c*) that overlays the semiconductor memory chip 9 from above the film wiring substrate 8 and electrically connects the connection terminal group 2 and the connection terminal group 10 corresponds to one example of a second terminal connecting step of the present invention.

Next, as shown in FIG. 2(*d*), onto the resin substrate 12, is loaded the electronic component implementing structure intermediate body 60 of the constitution shown in FIG. 2(*c*) such that the semiconductor memory chip 9 has been overlaid to the semiconductor logical circuit chip 1. In one face of this resin substrate 12, is formed the connection terminal group 13, and the connection terminal group 14 is formed in the other face. Moreover, in the resin substrate 12, is formed the through hole 15 that connects the connection terminal group 13 and the connection terminal group 14, and the protruding electrode 17 is formed on the connection terminal group 13.

Figure 2D:
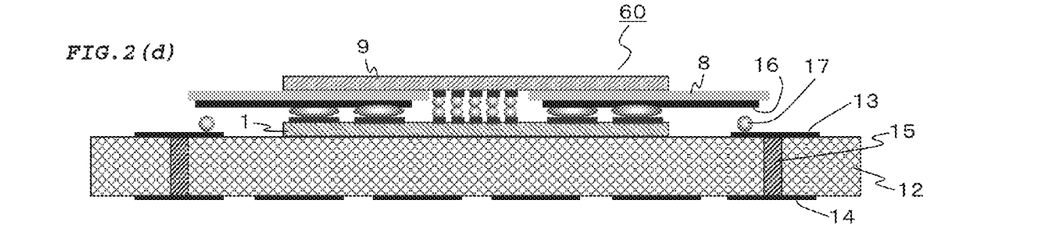
Figure 2E:
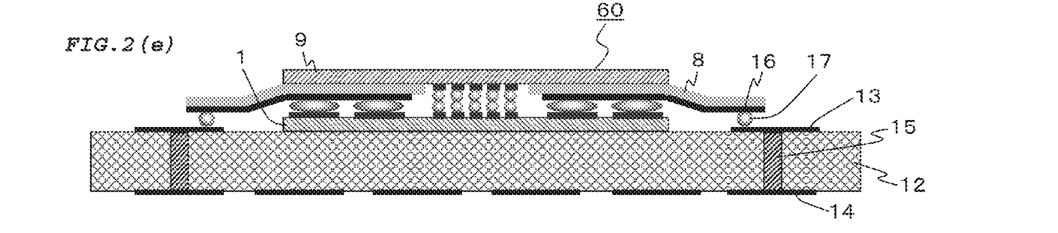

Further, the resin substrate 12 is in close contact with the semiconductor logical circuit chip 1 via an adhesive and the like, which is not shown here. Moreover, here, the protruding electrode 17 is allowed to be formed on the connection terminal group 13, but the protruding electrode 17 may be allowed to be formed on the connection terminal group 16 that has been formed in the film wiring substrate 8.

Next, as shown in FIG. 2(*e*), the connection terminal group 16 that has been formed on the film wiring substrate 8 and the connection terminal group 13 that has been formed on the resin substrate 12 are electrically connected via the protruding electrode 17.

Further, the step shown in FIG. 2(*d*) that loads the semiconductor logical circuit chip 1 onto the resin substrate 12 corresponds to one example of a semiconductor chip loading step of the present invention. Moreover, the step shown in FIG. 2(*e*) that electrically connects the connection terminal group 16 that has been formed on the film wiring substrate 8 and the connection terminal group 13 that has been formed on the resin substrate 12 corresponds to one example of a third terminal connecting step of the present invention.

Finally as shown in FIG. 2(*f*), by forming the protruding electrode 18 on the connection terminal group 14 that has been formed on the resin substrate 12, the electronic component implementing structure body is able to be fabricated.

Further, in the present embodiment, the semiconductor logical circuit chip 1 and the semiconductor memory chip 9 are both of the same size of 5 mm×5 mm, and the resin substrate 12 is of a size of 14 mm×14 mm, but there may be any magnitude correlation between both of the two chips.

Figure 4A:
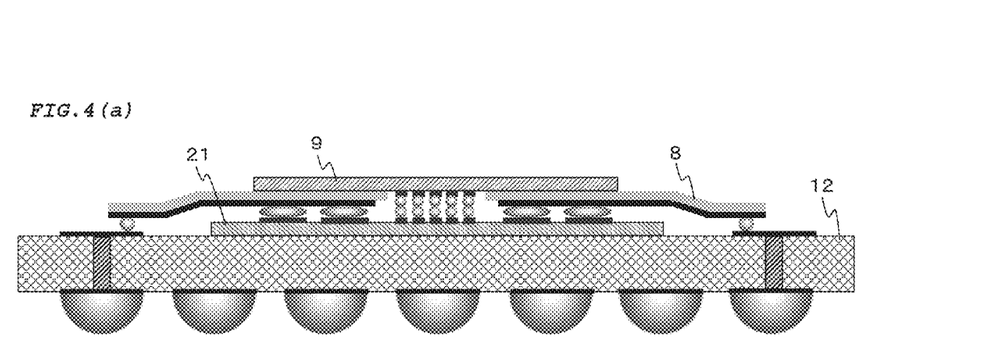
FIG. 4(a) is a sectional view of the electronic component implementing structure body in a case where, in the first embodiment of the present invention, has been utilized a semiconductor logical circuit chip the size of which is larger than that of the semiconductor memory chip.

FIG. 4(*a*) shows a sectional view of the electronic component implementing structure body of the present embodiment in a case where, with respect to the semiconductor memory chip 9 of a size of 5 mm×5 mm, the semiconductor logical circuit chip 21 of a size of 8 mm×8 mm has been utilized.

Figure 4B:
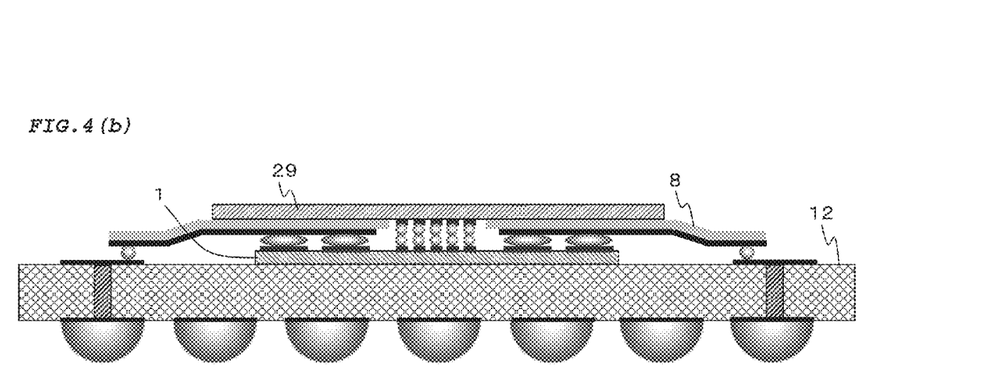
FIG. 4(b) is a sectional view of the electronic component implementing structure body in a case where, in the first embodiment of the present invention, has been utilized a semiconductor memory chip the size of which is larger than that of the semiconductor logical circuit chip.

Moreover, FIG. 4(*b*) shows a sectional view of the electronic component implementing structure body of the present embodiment in a case where, with respect to the semiconductor logical circuit chip 1 of a size of 5 mm×5 mm, the semiconductor memory chip 29 of a size of 8 mm×8 mm has been utilized.

Moreover, in the present embodiment, the connection terminal groups 2, 3 and 10 are, for example, formed by aluminum and the like, but a metal like copper the conductivity of which is higher than that of aluminum may be utilized. Besides, with a nickel/gold plating process applied copper may be allowed to be in a state of being less oxidation-prone.

Moreover, the connection terminal groups 7, 13, 14 and 16 are, for example, formed by copper and the like but besides, with a nickel/gold plating process applied it may be allowed to be in a state of being less oxidation-prone.

Moreover, the protruding electrodes 4, 5, 11, 17 and 18 are, for example, formed by solder and the like, but a metal such as copper or gold may be utilized.

Moreover, the film wiring layer 6 is, for example, formed by copper and the like but besides, with a nickel/gold plating process applied it may be allowed to be in a state of being less oxidation-prone.

Moreover, the film wiring substrate 8 is, for example, formed by polyimide (PI) and the like, but an insulating material such as liquid crystal polymer (LCP), polyethylene terephthalate (PET), polyethylene naphthalate (PEN), polyether ether ketone (PEEK), aramid and the like may be utilized.

Moreover, the resin substrate 12 is, for example, formed by a glass epoxy substrate and the like, but a build-up substrate, an aramid-epoxy substrate, a ceramic substrate and the like may be utilized.

Besides, the gap between the semiconductor logical circuit chip 1 and the semiconductor memory chip 9 that have been overlaid, the gap between the film wiring substrate 8 and the resin substrate 12, or the like, which is not shown in FIG. 2, may be sealed by a mold resin.

Further, in the steps of FIG. 2(*b*) to FIG. 2(*c*), after the film wiring substrate 8 has been allowed to stick to the semiconductor memory chip 9 beforehand, that semiconductor memory chip 9 may be overlaid onto the semiconductor logical circuit chip 1, so that the protruding electrode 5 and the connection terminal group 7 are electrically connected, and the protruding electrode 4 and the protruding electrode 11 are electrically connected.

Moreover, in the present embodiment, after the electronic component implementing structure intermediate body 60 shown in FIG. 2(*c*) has been formed, it is allowed to be loaded onto the resin substrate 12 (FIG. 2(*d*)), but the semiconductor logical circuit chip 1 shown in FIG. 2(*a*) may be loaded onto the resin substrate 12 beforehand, so that, after that, the steps of FIGS. 2(*b*), (*c*), (*e*) and (*f*) are performed in order.

Like this, the electronic component implementing structure body of the present embodiment is characterized in that the film wiring substrate 8 that has flexibility is arranged between the semiconductor logical circuit chip 1 and the semiconductor memory chip 9, the mutual connection terminal groups of the chips are electrically connected, the mutual connection terminal groups of the film wiring substrate 8 and the semiconductor logical circuit chip 1 are electrically connected and, besides, the mutual connection terminal groups of the resin substrate 12 and the film wiring substrate 8 are electrically connected.

By having made constitution like this, in a semiconductor device in which, by the CoC technology, the semiconductor memory chip and the semiconductor logical circuit chip have been overlaid, connection to the resin substrate becomes possible even if each chip is of the same size (the difference between each correspondingly opposing side of each chip is within ±5%), and the transmission characteristics of high speed signals are improved by utilizing a film wiring substrate. Besides, a semiconductor package is able to be easily fabricated such that it is possible to alleviate position aberration during the connection of the connection terminal group of the semiconductor logical circuit chip and the connection terminal group of the semiconductor memory chip.

Second Embodiment

FIGS. 5(a)-(f) are sectional views that show the forming step of an electronic component implementing structure body pertaining to the second embodiment of the present invention.

The structure of the electronic component implementing structure body fabricated in the present embodiment is similar to that of the electronic component implementing structure body of the first embodiment shown in FIG. 1, but its fabricating method differs from that of the first embodiment.

In what follows, descriptions are given regarding the fabricating method of the electronic component implementing structure body in the present embodiment.

Figure 5A:
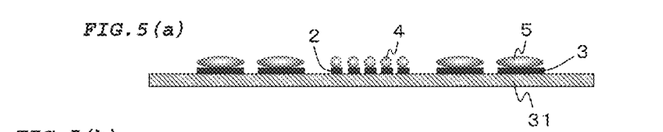
FIGS. 5(a)-(f) are sectional views that show the forming step of the electronic component implementing structure body pertaining to the second embodiment of the present invention.

In the beginning, as shown in FIG. 5(a), the connection terminal group 2 and the connection terminal group 3 are formed on one face of the semiconductor logical circuit chip 31 that is made of a semiconductor material, the protruding electrode 4 is formed besides on the connection terminal group 2, and the protruding electrode 5 is formed on the connection terminal group 3.

Figure 5B:
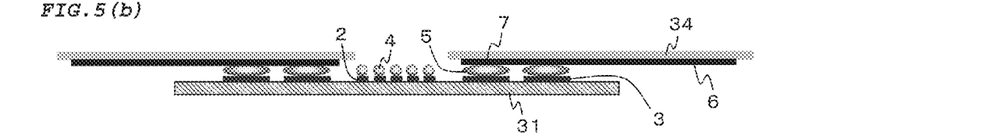

Next, as shown in FIG. 5(b), the film wiring substrate 34 with the film wiring layer 6 and the connection terminal group 7 formed on one face is overlaid onto the semiconductor logical circuit chip 31, and the protruding electrode 5 and the connection terminal group 7 are electrically connected. At this time, the film wiring substrate 34 is laminated on the semiconductor logical circuit chip 31 so as not to interfere with the protruding electrode 4.

Further, the steps in the present embodiment shown in FIGS. 5(a) and (b) are the same as the steps shown in FIGS. 2(a) and (b) of the first embodiment.

Figure 5C:
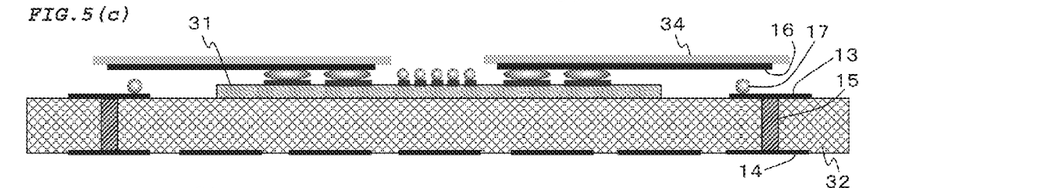

Next, as shown in FIG. 5(c), onto the resin substrate (interposer substrate) 32, is loaded the semiconductor logical circuit chip 31 to which the film wiring substrate 34 has been overlaid. In one face of this resin substrate 32, is formed the connection terminal group 13, and the connection terminal group 14 is formed in the other face. Moreover, in the resin substrate 32, is formed the through hole 15 that connects the connection terminal group 13 and the connection terminal group 14, and the protruding electrode 17 is formed on the connection terminal group 13.

Further, the resin substrate 32 is in close contact with the semiconductor logical circuit chip 31 via an adhesive and the like, which is not shown here. Moreover, here, the protruding electrode 17 is allowed to be formed on the connection terminal group 13, but the protruding electrode 17 may be allowed to be formed on the connection terminal group 16 that has been formed in the film wiring substrate 34.

Figures 5D, 5E:
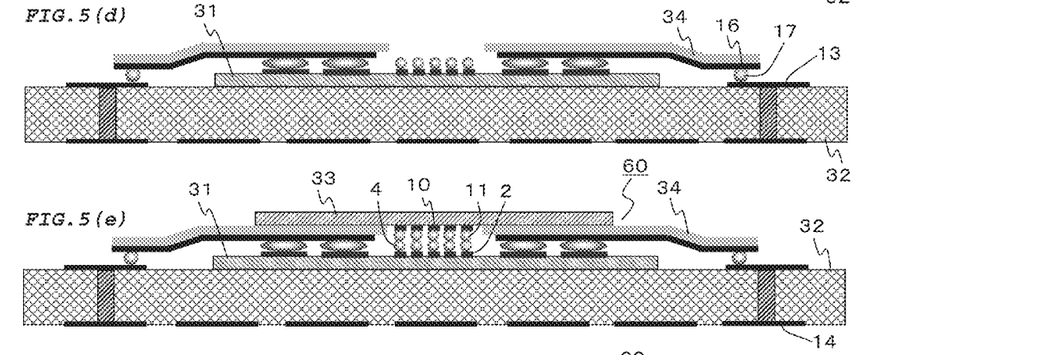

Next, as shown in FIG. 5(d), the connection terminal group 16 that has been formed on the film wiring substrate 34 and the connection terminal group 13 that has been formed on the resin substrate 32 are electrically connected via the protruding electrode 17.

Next, as shown in FIG. 5(e), the semiconductor memory chip 33, which is made of a semiconductor material, such that the connection terminal group 10 has been formed on one face and besides, the protruding electrode 11 has been formed on it, is overlaid onto the film wiring substrate 34, and the protruding electrode 4 and the protruding electrode 11 are electrically connected.

Further, the step shown in FIG. 5(c) that loads the semiconductor logical circuit chip 31 onto the resin substrate 32 corresponds to one example of a semiconductor chip loading step of the present invention. Moreover, the step shown in FIG. 5(d) that electrically connects the connection terminal group 16 that has been formed on the film wiring substrate 34 and the connection terminal group 13 that has been formed on the resin substrate 32 corresponds to one example of a third terminal connecting step of the present invention. Moreover, the step shown in FIG. 5(e) that overlays the semiconductor memory chip 33 from above the film wiring substrate 34 and electrically connects the connection terminal group 2 and the connection terminal group 10 corresponds to one example of a second terminal connecting step of the present invention.

Figure 5F:
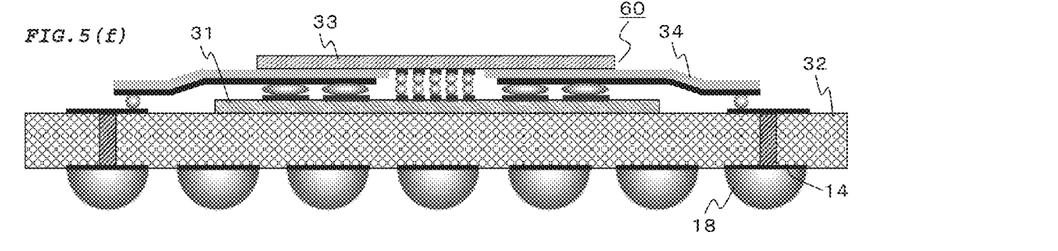

Finally as shown in FIG. 5(f), by forming the protruding electrode 18 on the connection terminal group 14 that has been formed on the resin substrate 32, the electronic component implementing structure body is able to be fabricated.

Further, in the present embodiment, the semiconductor logical circuit chip 31 is of a size of 8 mm×8 mm, the semiconductor memory chip 33 is of a size of 5 mm×10 mm and, the resin substrate 32 is of a size of 35 mm×35 mm.

Moreover, the gap between the semiconductor logical circuit chip 31 and the semiconductor memory chip 33 that have been overlaid, the gap between the film wiring substrate 34 and the resin substrate 32, or the like, which is not shown here, may be sealed by a mold resin.

Like this, the present embodiment is characterized in that, in the electronic component implementing structure body comprising the electronic component implementing structure intermediate body 60 such that the film wiring substrate 34 that has flexibility is arranged between the semiconductor logical circuit chip 31 and the semiconductor memory chip 33, the mutual connection terminal groups of the film wiring substrate 34 and the semiconductor logical circuit chip 31 are electrically connected, the mutual connection terminal groups of the resin substrate 32 and the film wiring substrate 34 are electrically connected and, besides, the mutual connection terminal groups of the chips are electrically connected.

By having made constitution like this, in a semiconductor device in which, by the CoC technology, the semiconductor memory chip and the semiconductor logical circuit chip have been overlaid, connection to the resin substrate becomes possible even if each chip is of arbitrary size, and the transmission characteristics of high speed signals are improved by utilizing a film wiring substrate. Besides, a semiconductor package is able to be easily fabricated such that it is possible to alleviate position aberration during the electrical connection of the connection terminal group of the film wiring substrate and the connection terminal group of the resin substrate.

Third Embodiment

Figure 6:
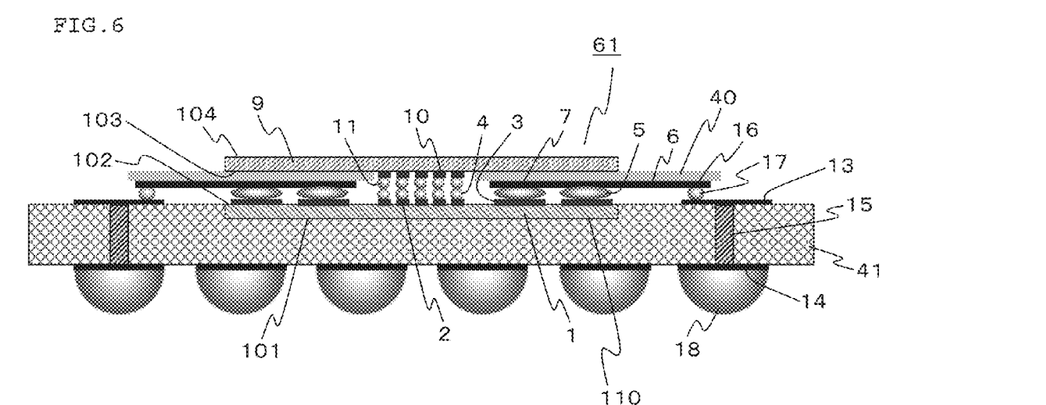
FIG. 6 is a sectional view that shows the constitution of an electronic component implementing structure body pertaining to the third embodiment of the present invention.

FIG. 6 is a sectional view that shows the constitution of an electronic component implementing structure body pertaining to the third embodiment of the present invention.

The electronic component implementing structure body of the present embodiment differs, when compared with the electronic component implementing structure body of the first embodiment that has been shown in FIG. 1, in that the film wiring substrate 40 does not have flexibility, and in that the depression part 110 is formed in a portion of the resin substrate 41 on which the semiconductor logical circuit chip 1 is loaded.

As shown in FIG. 6, the semiconductor logical circuit chip 1 that has the first plane 101 and the second plane 102, and the semiconductor memory chip 9 that has the third plane 103 and the fourth plane 104 are overlaid, the film wiring substrate 40 that does not have flexibility is, between the semiconductor logical circuit chip 1 and the semiconductor memory chip 9, arranged, and the electronic component implementing structure intermediate body 61 of the present embodiment is constituted.

Electrically connected via the protruding electrode 4 and the protruding electrode 11 are the connection terminal group 2 of the second plane 102 and the connection terminal group 10 of the third plane 103, and the connection terminal group 3 of the second plane 102 and the connection terminal group 7 on the film wiring substrate 40 are electrically connected via the protruding electrode 5.

Besides, on the depression part 110 that has been formed on the resin substrate (interposer substrate) 41 that has the connection terminal group 13 in one face and the connection terminal group 14 in the other face, and has the through hole 15 which connects the two, the electronic component implementing structure intermediate body 61 of the present embodiment is loaded so that the portion of the semiconductor logical circuit chip 1 fits thereinto, and the electronic component implementing structure body of the present embodiment is constituted.

The connection terminal group 16 that has been formed on the film wiring substrate 40 and the connection terminal group 13 that has been formed on the resin substrate 41 are electrically connected via the protruding electrode 17. Besides, the protruding electrode 18 is formed in the connection terminal group 14 that has been formed on the resin substrate 41.

Further, the depression part 110 that has been formed on the resin substrate 41 corresponds to one example of a concave portion of the present invention.

As for the electronic component implementing structure body of the present embodiment, since the space between the connection terminal group 16 that has been formed on the film wiring substrate 40 and the connection terminal group 13 that has been formed on the resin substrate 41 is, by having made constitution such that the portion of the semiconductor logical circuit chip 1 fits into the depression part 110 that has been formed on the resin substrate 41, enabled to be narrower than that in the case of the electronic component implementing structure body of Embodiment 1 that has been shown in FIG. 1(*a*), even if the film wiring substrate 40 does not have flexibility, these mutual connection terminal groups are enabled to be connected via the protruding electrode 17.

Further, in the present embodiment, descriptions have been given assuming that the film wiring substrate 40 does not have flexibility, but it may have flexibility.

Like this, the present embodiment is characterized in that, in the electronic component implementing structure body comprising the electronic component implementing structure intermediate body 61 such that the film wiring substrate 40 is arranged between the semiconductor logical circuit chip 1 and the semiconductor memory chip 9, the mutual connection terminal groups of the chips are electrically connected, the mutual connection terminal groups of the film wiring substrate 40 and the semiconductor logical circuit chip 1 are electrically connected and, besides, the semiconductor logical circuit chip 1 is loaded on the depression part 110 of the resin substrate 41, and the mutual connection terminal groups of the resin substrate 41 and the film wiring substrate 40 are electrically connected.

By having made constitution like this, in a semiconductor device in which, by the CoC technology, the semiconductor memory chip and the semiconductor logical circuit chip have been overlaid, connection to the resin substrate becomes possible even if each chip is of arbitrary size, and the transmission characteristics of high speed signals are improved by utilizing a film wiring substrate. Besides, a semiconductor package is able to be easily fabricated such that it is also possible to alleviate, during the connection of the connection terminal group of the film wiring substrate and the connection terminal group of the resin substrate, by alleviating the bending of the film wiring substrate, position aberration of the connection terminals.

Fourth Embodiment

Figure 7:
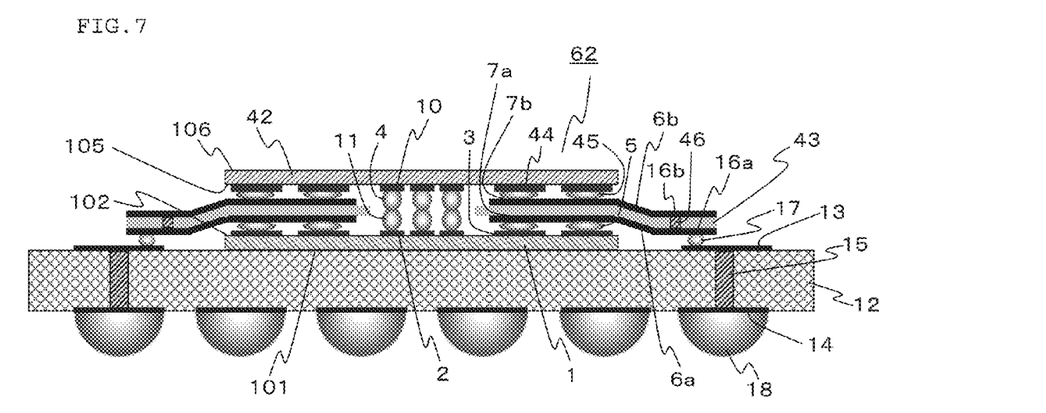
FIG. 7 is a sectional view that shows the constitution of an electronic component implementing structure body pertaining to the fourth embodiment of the present invention.

FIG. 7 is a sectional view that shows the constitution of an electronic component implementing structure body pertaining to the fourth embodiment of the present invention.

As shown in FIG. 7, the semiconductor logical circuit chip 1 that has the first plane 101 and the second plane 102, and the semiconductor memory chip 42 that has the fifth plane 105 and the sixth plane 106 are overlaid, the film wiring substrate 43 that has flexibility is, between the semiconductor logical circuit chip 1 and the semiconductor memory chip 42, arranged, and the electronic component implementing structure intermediate body 62 of the present embodiment is constituted.

Electrically connected via the protruding electrode 4 and the protruding electrode 11 are the connection terminal group 2 of the second plane 102 and the connection terminal group 10 of the fifth plane 105, the connection terminal group 3 of the second plane 102 and the connection terminal group 7*a* on the film wiring substrate 43 are electrically connected via the protruding electrode 5, and the connection terminal group 44 of the fifth plane 105 and the connection terminal group 7*b* on the film wiring substrate 43 are electrically connected via the protruding electrode 45.

Besides, on the resin substrate (interposer substrate) 12 that has the connection terminal group 13 in one face and the connection terminal group 14 in the other face, and has the through hole 15 which connects the two, the electronic component implementing structure intermediate body 62 of the present embodiment is loaded, and the electronic component implementing structure body of the present embodiment is constituted.

The connection terminal group 16*a* that has been formed on the film wiring substrate 43 and the connection terminal group 13 that has been formed on the resin substrate 12 are electrically connected via the protruding electrode 17.

Further, the film wiring layer 6*a* and the film wiring layer 6*b* that have been formed in each face of the film wiring substrate 43 are connected via the connection terminal group 16*a*, the connection terminal group 16*b* and the via hole 46. Besides, the protruding electrode 18 is formed in the connection terminal group 14 that has been formed on the resin substrate 12.

Like this, the present embodiment is characterized in that, in the electronic component implementing structure body comprising the electronic component implementing structure intermediate body 62 such that the film wiring substrate 43 that has flexibility is arranged between the semiconductor logical circuit chip 1 and the semiconductor memory chip 42, the mutual connection terminal groups of the chips are electrically connected, the mutual connection terminal groups of the film wiring substrate 43 and the semiconductor logical circuit chip 1 are electrically connected, the mutual connection terminal groups of the film wiring substrate 43 and the semiconductor memory chip 42 are electrically connected and, besides, the mutual connection terminal groups of the resin substrate 12 and the film wiring substrate 43 are electrically connected.

By having made constitution like this, in a semiconductor device in which, by the CoC technology, the semiconductor memory chip and the semiconductor logical circuit chip have been overlaid, connection to the resin substrate becomes possible even if each chip is of arbitrary size, and the transmission characteristics of high speed signals are improved by utilizing a film wiring substrate. Besides, by not only connecting the connection terminal groups of the semiconductor logical circuit chip and the film wiring substrate, but also connecting the connection terminal groups of the semiconductor memory chip and the film wiring substrate, a semiconductor package is able to be easily fabricated such that the wiring accommodation property on the semiconductor memory chip is high.

Fifth Embodiment

Figure 8:
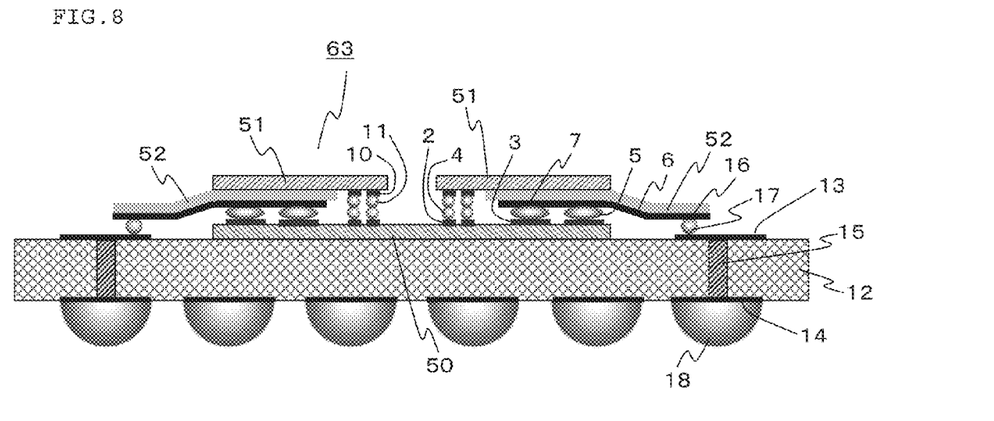
FIG. 8 is a sectional view that shows the constitution of an electronic component implementing structure body pertaining to the fifth embodiment of the present invention.

FIG. 8 is a sectional view that shows the constitution of an electronic component implementing structure body pertaining to the fifth embodiment of the present invention.

The electronic component implementing structure body of the present embodiment is one such that, in a semiconductor device that has been described in the first embodiment, in which, by the CoC technology, the semiconductor memory chip and the semiconductor logical circuit chip have been laminated via the film wiring substrate, the constitution has been made so that onto the resin substrate 12 is loaded the electronic component implementing structure intermediate body 63 with constitution having been made such that, with respect to the one semiconductor logical circuit chip 50, the two film wiring substrates 52 are sandwiched, respectively, by the two semiconductor memory chips 51 that are arranged side by side.

By taking constitution like this, a semiconductor package is able to be easily fabricated such that the semiconductor chips are arranged with high density, the semiconductor memory chips of high capacity are loaded, and the transmission characteristics of high speed signals are improved.

Sixth Embodiment

Figure 9:
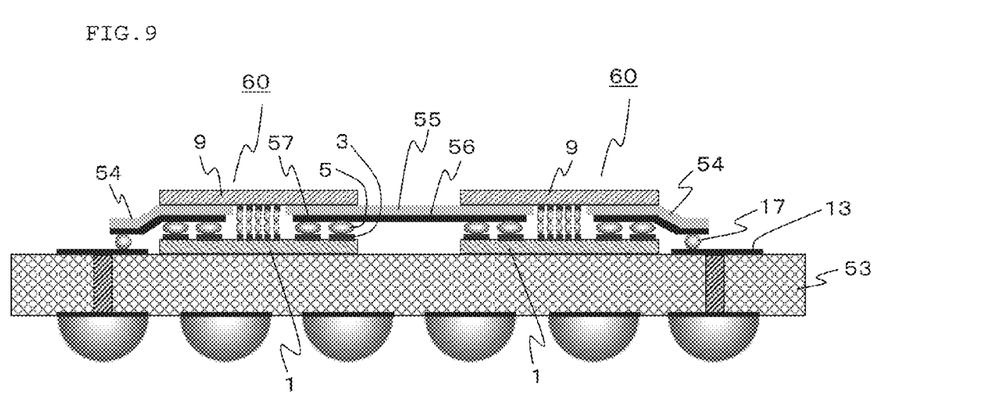
FIG. 9 is a sectional view that shows the constitution of an electronic component implementing structure body pertaining to the sixth embodiment of the present invention.

FIG. 9 is a sectional view that shows the constitution of an electronic component implementing structure body pertaining to the sixth embodiment of the present invention.

The electronic component implementing structure body of the present embodiment is one such that the electronic component implementing structure intermediate bodies 60 that have been described in the first embodiment, in which, by the CoC technology, the semiconductor memory chips 9 and the semiconductor logical circuit chips 1 have been laminated via the film wiring substrates have been, onto one sheet of the resin substrate 53, loaded side by side in duplicate.

Here, the connection terminal groups 3 of the semiconductor logical circuit chips 1 are, via the film wiring substrates 54, connected to the connection terminal group 13 on the resin substrate 53, and the mutual connection terminal groups 3 of the two semiconductor logical circuit chips 1 are connected via the connection terminal group 57 and the film wiring layer 56 of the film wiring substrate 55.

By taking constitution like this, a semiconductor package is able to be easily fabricated such that the semiconductor chips are arranged with high density and, in between the semiconductor logical circuit chip and the semiconductor memory chip or, alternatively, in between the mutual semiconductor logical circuit chips, the transmission characteristics of high speed signals are improved.

Further, in the above-mentioned first to sixth embodiments, even if the area of the semiconductor memory chip is larger than the area of the semiconductor logical circuit chip and, besides, the semiconductor memory chip completely covers the semiconductor logical circuit chip as in FIG. 4(*b*), since the film wiring substrate is arranged between the semiconductor logical circuit chip and the semiconductor memory chip, connection to the resin substrate 12 becomes possible, the chip size is downsized, and a semiconductor package that is excellent in the transmission characteristics of high speed signals is able to be furnished by utilizing the film wiring substrate.

Moreover, one example of a first semiconductor chip of the present invention corresponds to the semiconductor logical circuit chips 1, 21, 31 and 50, and one example of a second semiconductor chip of the present invention corresponds to the semiconductor memory chips 9, 29, 33, 42 and 51 but, as one example of a second semiconductor chip of the present invention, a semiconductor logical circuit chip may be utilized, where a semiconductor memory chip is utilized as one example of a first semiconductor chip of the present invention. Namely, in the above-mentioned first through sixth embodiments, the semiconductor logical circuit chips 1, 21, 31 and 50 are arranged on the resin substrates 12, 32, 41 and 53, and the semiconductor memory chips 9, 29, 33, 42 and 51 are arranged so as to confront the semiconductor logical circuit chips 1, 21, 31 and 50, but the semiconductor logical circuit chips 1, 21, 31 and 50 may be arranged so as to confront the semiconductor memory chips 9, 29, 33, 42 and 51, where the semiconductor memory chips 9, 29, 33, 42 and 51 are arranged on the resin substrates 12, 32, 41 and 53. Moreover, the first semiconductor chip and the second semiconductor chip may be allowed to have similar functions. Besides, in the above-mentioned embodiments, descriptions have been performed regarding electronic component implementing structure bodies of constitution such that two semiconductor chips have been laminated, but constitution such that three or more semiconductor chips have been laminated may be allowed.

As has been described above, by utilizing an electronic component implementing structure intermediate body, an electronic component implementing structure body and a manufacturing method thereof of the present invention, in a semiconductor device in which semiconductor chips have been laminated by the CoC technology, a great effect is taken such that, even in a case where plural semiconductor chips have been loaded, connection to an interposer substrate is carried out with arbitrary chip size, downsizing of the chip size becomes possible, and a semiconductor package that is excellent in the transmission characteristics of high speed signals is furnished by utilizing a film wiring substrate.

INDUSTRIAL APPLICABILITY

An electronic component implementing structure intermediate body, an electronic component implementing structure body and a manufacturing method thereof pertaining to the present invention are, in a semiconductor device in which at least two semiconductor chips have been laminated by the CoC technology, useful to the field of various electronic equipment, especially digital AV equipment or portable electronic equipment, since allowing downsizing of the chips to be possible even if each chip is of arbitrary size.

DESCRIPTION OF SYMBOLS 1, 21, 31, 50 semiconductor logical circuit chip
2, 3, 7, 7a, 7b, 10, 13, 14, 16, 16a, 16b, 44, 57 connection terminal group
4, 5, 11, 17, 18, 45 protruding electrode
6, 6a, 6b, 26, 56 film wiring layer
8, 23, 24, 34, 40, 43, 52, 54, 55 film wiring substrate
9, 29, 33, 42, 51 semiconductor memory chip
12, 32, 41, 53 resin substrate
15 through hole
19 boring hole
20 notch
46 via hole
60, 61, 62, 63 electronic component implementing structure intermediate body
91 wire
101 first plane
102 second plane
103 third plane
104 fourth plane
105 fifth plane
106 sixth plane
110 depression part

The invention claimed is:

1. An electronic component implementing structure body, comprising:
an electronic component implementing structure intermediate body; and a chip loading substrate, wherein the electronic component implementing structure intermediate body comprises:
a first semiconductor chip that has a first connection terminal on one face;
a second semiconductor chip that has a second connection terminal on a face which faces the one face of the first semiconductor chip; and
a film wiring substrate that is allowed to be divided into 4 pieces, has flexibility, has a third connection terminal at least on one face, and is arranged between the first semiconductor chip and the second semiconductor chip,
at least one part of the first connection terminal is connected with at least one part of the second connection terminal,
the third connection terminal is connected at least with either of another one part of the first connection terminal and another one part of the second connection terminal,
on the film wiring substrate, there is a portion that is located outside any end parts of the first semiconductor chip and the second semiconductor chip,
at a tip part of the portion, is provided a fourth connection terminal that is connected to the third connection terminal by wiring,
the chip loading substrate has a fifth connection terminal, on which the electronic component implementing structure intermediate body is loaded so that another one face of the first semiconductor chip is confronted by the chip loading substrate,
the fifth connection terminal is connected to the fourth connection terminal of the film wiring substrate, and
the film wiring substrate is curved between the third connection terminal and the fifth connection terminal.

2. An electronic component implementing structure body according to claim 1, wherein
on the film wiring substrate, is provided a hole part, and
the at least one part of the first connection terminal, and the at least one part of the second connection terminal are connected via the hole part.

3. An electronic component implementing structure body according to claim 1, wherein
on at least one spot of an outer fringe part of the film wiring substrate, there is a notch.

4. An electronic component implementing structure body according to claim 1, wherein
the first semiconductor chip and the second semiconductor chip are arranged so as to be opposing, and a difference in length between each correspondingly opposing side of the first semiconductor chip and the second semiconductor chip is within ±5%.

5. A manufacturing method of an electronic component implementing structure body, comprising:
a semiconductor chip loading step of loading, onto a chip loading substrate, a first semiconductor chip with a first connection terminal formed on one face so that a face on which the first connection terminal is not formed is confronted by the chip loading substrate;
a first terminal connecting step of electrically connecting one part of the first connection terminal of the first semiconductor chip, and a third connection terminal formed on one face of a film wiring substrate that is allowed to be divided into 4 pieces;
a second terminal connecting step of, from a side where connection of the film wiring substrate of the first semiconductor chip has been carried out, overlaying and laminating a second semiconductor chip with a second connection terminal formed on one face, and then electrically connecting a first connection terminal that is not connected to the third connection terminal, and the second connection terminal; and
a third terminal connecting step of electrically connecting, to a fifth connection terminal that is formed on the chip loading substrate, a fourth connection terminal that is connected to the third connection terminal and is formed at a tip portion of a portion of the film wiring substrate, the portion being located outside any end parts of the first semiconductor chip and the second semiconductor chip, wherein
the film wiring substrate is curved between the third connection terminal and the fifth connection terminal.

6. A manufacturing method of an electronic component implementing structure body according to claim 5, wherein
processing of the first terminal connecting step, the second terminal connecting step, the semiconductor chip loading step, and the third terminal connecting step are carried out in that order.

7. A manufacturing method of an electronic component implementing structure body according to claim 5, wherein
processing of the first terminal connecting step, the semiconductor chip loading step, the third terminal connecting step, and the second terminal connecting step are carried out in that order.

8. A manufacturing method of an electronic component implementing structure body according to claim 5, wherein
processing of the semiconductor chip loading step, the first terminal connecting step, the second terminal connecting step, and the third terminal connecting step are carried out in that order.

* * * * *

UNITED STATES PATENT AND TRADEMARK OFFICE
CERTIFICATE OF CORRECTION

PATENT NO.       : 9,041,221 B2
APPLICATION NO.  : 13/993714
DATED            : May 26, 2015
INVENTOR(S)      : Shozo Ochi et al.

Page 1 of 1

It is certified that error appears in the above-identified patent and that said Letters Patent is hereby corrected as shown below:

On the title page, insert -- (30) Foreign Application Priority Data
                            December 24, 2010  (JP)  2010-288285 --.

Signed and Sealed this
Fifteenth Day of March, 2016

Michelle K. Lee
*Director of the United States Patent and Trademark Office*